(12) United States Patent
Fagan et al.

(10) Patent No.: US 10,483,101 B2
(45) Date of Patent: Nov. 19, 2019

(54) GLASS-BASED ARTICLE WITH ENGINEERED STRESS DISTRIBUTION AND METHOD OF MAKING SAME

(71) Applicant: CORNING INCORPORATED, Corning, NY (US)

(72) Inventors: Sumalee Likitvanichkul Fagan, Painted Post, NY (US); William John Furnas, Elmira, NY (US); Ekaterina Aleksandrovna Kuksenkova, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 202 days.

(21) Appl. No.: 15/633,000

(22) Filed: Jun. 26, 2017

(65) Prior Publication Data

US 2018/0005822 A1    Jan. 4, 2018

Related U.S. Application Data

(60) Provisional application No. 62/356,904, filed on Jun. 30, 2016.

(51) Int. Cl.
*B32B 15/04*    (2006.01)
*H01L 21/02*    (2006.01)
(Continued)

(52) U.S. Cl.
CPC ........ *H01L 21/02422* (2013.01); *C03B 23/02* (2013.01); *C03B 25/025* (2013.01);
(Continued)

(58) Field of Classification Search
USPC .................................................. 428/426, 409
See application file for complete search history.

(56) References Cited

U.S. PATENT DOCUMENTS 8,859,103 B2 * 10/2014 Canale ................... C03C 17/00
                                                           428/426
9,227,295 B2    1/2016 Markham et al.
(Continued)

FOREIGN PATENT DOCUMENTS

CN    102634850 A    8/2012
CN    105084749 A    11/2015
(Continued)

OTHER PUBLICATIONS

No Author, "Polariscopic Examination of Glass Container Sections, Standard Testing Procedure Committee of the Glass Container Association," J Am Ceramic Society, vol. 27, No. 3, Mar. 1944, pp. 85-89.
(Continued)

*Primary Examiner* — Lauren R Colgan
(74) *Attorney, Agent, or Firm* — John P. McGroarty

(57) ABSTRACT

Disclosed herein are glass-based articles having a first surface having an edge, wherein a maximum optical retardation of the first surface is at the edge and the maximum optical retardation is less than or equal to about 40 nm and wherein the optical retardation decreases from the edge toward a central region of the first surface, the central region having a boundary defined by a distance from the edge toward a center point of the first surface, wherein the distance is ½ of the shortest distance from the edge to the center point.

17 Claims, 5 Drawing Sheets

(51) Int. Cl.
*C03C 3/097* (2006.01)
*C03C 23/00* (2006.01)
*C03B 25/02* (2006.01)
*C03B 29/02* (2006.01)
*H01L 21/687* (2006.01)
*C03C 3/083* (2006.01)
*C03C 4/00* (2006.01)
*C03C 19/00* (2006.01)
*C03B 23/02* (2006.01)

(52) U.S. Cl.
CPC ............ *C03B 29/025* (2013.01); *C03C 3/083* (2013.01); *C03C 3/097* (2013.01); *C03C 4/00* (2013.01); *C03C 19/00* (2013.01); *C03C 23/007* (2013.01); *H01L 21/68757* (2013.01); *C03C 2204/00* (2013.01)

(56) References Cited

U.S. PATENT DOCUMENTS

| | | | |
|---|---|---|---|
| 2007/0137253 A1* | 6/2007 | Beall | C03B 19/1453 65/384 |
| 2007/0263281 A1* | 11/2007 | Maxon | C03B 19/1453 359/352 |
| 2012/0302063 A1* | 11/2012 | Markham | B24B 1/00 438/692 |
| 2015/0099330 A1 | 4/2015 | Canale et al. | |
| 2016/0115074 A1* | 4/2016 | Yasuda | C03C 3/093 428/220 |
| 2016/0145141 A1 | 5/2016 | Bennett | |
| 2017/0045655 A1* | 2/2017 | Zhou | B32B 27/08 |

FOREIGN PATENT DOCUMENTS

| | | |
|---|---|---|
| JP | 08151224 A | 6/1996 |
| WO | 2002016280 A1 | 2/2002 |

OTHER PUBLICATIONS

Pallicity et al. "Numerical modeling of cooling stage of glass molding process assisted by CFD and measurement of residual birefringence" J. Am. Ceram. Soc. 99(2) pp. 470-483 (2016).
International Search Report and Written Opinion PCT/US2017/039370 dated Oct. 6, 2017.

* cited by examiner

GLASS-BASED ARTICLE WITH ENGINEERED STRESS DISTRIBUTION AND METHOD OF MAKING SAME

CROSS-REFERENCE TO RELATED APPLICATIONS

This application claims the benefit of priority under 35 U.S.C. § 119 of U.S. Provisional Application Ser. No. 62/356,904 filed on Jun. 30, 2016, the content of which is relied upon and incorporated herein by reference in its entirety.

BACKGROUND

The disclosure relates to glass-based articles that can be used as a carrier substrate, and more particularly to glass-based carrier substrates with an engineered stress distribution.

The semiconductor industry relies on carrier substrates or wafers to support silicon wafers during various manufacturing procedures including, for example, thinning of the silicon wafer as well as assembling of chips to the silicon wafer. Traditionally the carrier substrates or wafers were made of silicon. However, recently glass-based carrier substrates or wafers have been used in place of silicon carrier substrates. Typically, in such instances, the same equipment used for handling the silicon carrier substrates or wafer is used for handling the glass-based carrier substrates or wafers. A need exists for enabling glass-based carrier substrates or wafers to work the existing equipment used for silicon carrier substrates or wafers.

SUMMARY

In a first aspect, a glass-based article includes a first surface having an edge, wherein a maximum optical retardation of the first surface is at the edge and the maximum optical retardation is less than or equal to about 40 nm, and wherein the optical retardation decreases from the edge toward a central region of the first surface, the central region having a boundary defined by a distance from the edge toward a center point of the first surface, wherein the distance is ½ of the shortest distance from the edge to the center point.

In a second aspect according to the first aspect, the first surface has a flatness of less than or equal to about 25 µm.

In a third aspect according to the first or second aspect, the article has a coefficient of thermal expansion (CTE) in a range from about $25 \times 10^{-7}/°$ C. to about $130 \times 10^{-7}/°$ C. over a temperature range from 25° C. to 300° C.

In a fourth aspect according to any of the preceding aspects, the optical retardation at any point along the boundary of the central region is the same.

In a fifth aspect according to any of the preceding aspects, wherein a shape of the glass-based article is selected from the group consisting of a circle, a square, a rectangle and an oval.

In a sixth aspect according to any of the preceding aspects, wherein an optical retardation profile on the first surface is symmetrical relative to the center point of the surface.

In a seventh aspect according to any of the preceding aspects, the maximum optical retardation is less than or equal to about 25 nm.

In an eighth aspect according to any of the preceding aspects, wherein the maximum optical retardation is less than or equal to about 5 nm.

In a ninth aspect according to any of the preceding aspects, wherein the first surface has a flatness of less than or equal to about 20 µm.

In a tenth aspect according to any of the preceding aspects, the edge of the first surface is under compressive stress.

In an eleventh aspect according to the tenth aspect, a center of the first surface is under tension.

In a twelfth aspect according to any of the first through tenth aspects, the edge of the first surface is under tension.

In a thirteenth aspect according to the twelfth aspect, the center of the first surface is under compressive stress.

In a fourteenth aspect according to any of the preceding aspects, the glass-base article further includes a second surface opposing the first surface, wherein a maximum optical retardation of the second surface is at an edge and the maximum optical retardation is less than or equal to about 40 nm.

In a fifteenth aspect according to the twelfth aspect, the first surface has a flatness of less than or equal to about 25 µm.

In a sixteenth aspect according to the thirteenth aspect, the second surface has a flatness of less than or equal to about 25 µm.

In a seventeenth aspect according to any of the preceding aspects, the article is glass or glass-ceramic.

In an eighteenth aspect, a method for processing a glass-based substrate includes pressing a glass-based substrate having a first surface and a second opposing surface between two surfaces; heating the glass-based substrate pressed between the two surfaces such that the entire glass-based substrate is above a first temperature, wherein the first temperature is above the annealing temperature of the glass-based substrate; holding the glass-based substrate pressed between the two surfaces at the first temperature for a predetermined time; and cooling the glass-based substrate pressed between the two surfaces after the predetermined time such that the entire glass-based substrate is below a second temperature, wherein the second temperature is below the strain point of the glass-based substrate.

In a nineteenth aspect according to the eighteenth aspect, a maximum optical retardation of a first surface of the glass-based substrate is at the edge and the maximum optical retardation is less than or equal to about 40 nm and wherein the optical retardation decreases from the edge toward a central region of the first surface, the central region having a boundary defined by a distance from the edge toward a center point of the first surface, wherein the distance is ½ of the shortest distance from the edge to the center point.

In a twentieth aspect according to the eighteenth or nineteenth aspects, the article has a coefficient of thermal expansion (CTE) in a range from about $25 \times 10^{-7}/°$ C. to about $130 \times 10^{-7}/°$ C. over a temperature range from 25° C. to 300° C.

In a twenty-first aspect according to any one of the eighteenth through twentieth aspects, the first surface has a flatness of less than or equal to about 25 µm.

In a twenty-second aspect according to any one of the eighteenth through twenty-first aspects, wherein the maximum optical retardation of the first surface is less than or equal to about 5 nm.

In a twenty-third aspect according to any one of the eighteenth through twenty-second aspects, wherein the first surface has a flatness of less than or equal to about 20 µm.

In a twenty-fourth aspect according to any one of the eighteenth through twenty-third aspects, the heating occurs at a rate of at least about 1° C./min.

In a twenty-fifth aspect according to the twenty-fourth aspect, the heating occurs at a rate in a range from about 1° C./min to about 10° C./min.

In a twenty-sixth aspect according to any one of the eighteenth through twenty-fifth aspects, the predetermined time is at least about 1 hour.

In a twenty-seventh aspect according to the twenty-sixth aspect, the predetermined time is in a range from about 1 hour to about 5 hours.

In a twenty-eighth aspect according to any one of the eighteenth through twenty-seventh aspects, the cooling occurs at a rate of about 1° C./min or less.

In a twenty-ninth aspect according to any one of the eighteenth through twenty-eighth aspects, the first temperature is in a range from about 5° C. above the annealing temperature to about 10° C. above the annealing temperature.

In a thirtieth aspect according to any one of the eighteenth through twenty-ninth aspects, wherein an edge of the glass-based substrate cools faster than a center of the glass-based substrate.

In a thirty-first aspect according to any one of the eighteenth through twenty-ninth aspects, wherein a center of the glass-based substrate cools faster than an edge of the glass-based substrate.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

The following is a description of the figures in the accompanying drawings. The figures are not necessarily to scale, and certain figures and certain views of the figures may be shown exaggerated in scale or in schematic in the interest of clarity and conciseness.

DETAILED DESCRIPTION

Figure 1:
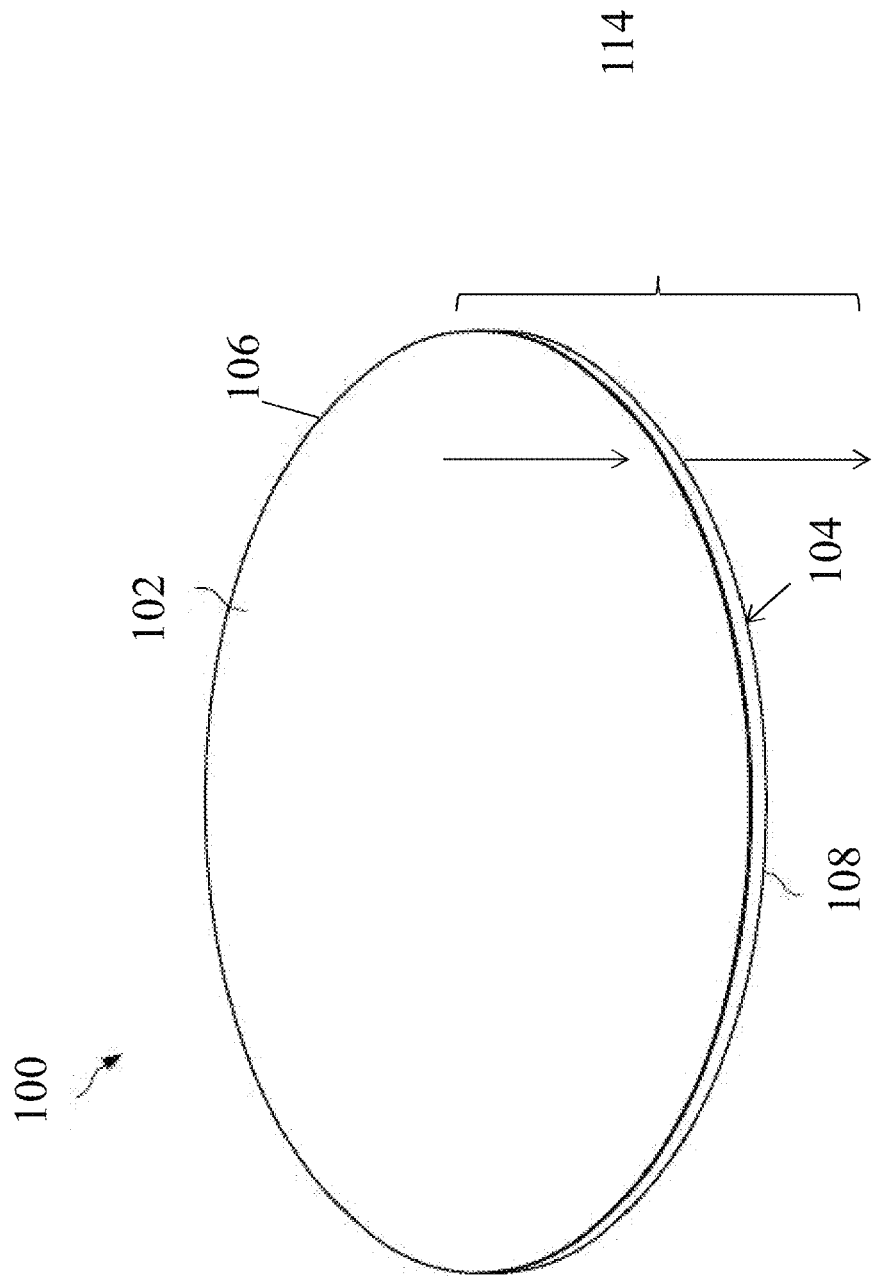
FIG. 1 is a perspective view of an exemplary glass-based article.

Reference will now be made in detail to the present preferred embodiment(s), an examples of which is/are illustrated in the accompanying drawings. Whenever possible, the same reference numerals will be used throughout the drawings to refer to the same or like parts.

Disclosed herein are glass-based articles that may be used as a carrier substrate or wafer to support a silicon wafer during semiconductor manufacturing. The glass-based articles are intended to be used in place of silicon carrier substrates and to be used with the same semiconductor industry equipment used to handle silicon carrier substrates during chip assembly. Depending upon the coefficient of thermal expansion (CTE) of the glass-based article, the glass-based article may have up to two times lower stiffness than silicon which can lead to breakage of the glass-based article during handling. Also, the glass-based articles may need to be polished to achieve a desired flatness to reduce pick-up failures from such equipment as pick-and-place arms and to reduce de-bonding from the silicon wafer during processing. The glass-based articles disclosed may have an engineered stress distribution and/or flatness that enables the glass-based articles to be used with existing equipment without the aforementioned problems. In some embodiments, the maximum optical retardation of a surface of the glass-based article is at the edge, the maximum optical retardation is less than or equal to about 40 nm, less than or equal to about 25 nm, or less than or equal to about 5 nm and the optical retardation decreases from the edge toward a central region of the first surface, wherein the central region having a boundary defined by a distance from the edge toward a center point of the first surface, wherein the distance is ½ of the shortest distance from the edge to the center point. In some embodiments, at least one surface of the glass-based article has a flatness of less than or equal to 25 μm or less than or equal to 20 μm. Also disclosed are methods for making glass-based articles with the above-mentioned features.

FIG. 1 shows a perspective view of an exemplary glass-based article 100 having a first surface 102 and an opposing second surface 104. First surface 102 has an edge 106 about the periphery of glass-based article 100. Likewise second surface 104 has an edge 108 about the periphery of glass-based article 100. Although glass-based article 100 is shown as being a circle, it should be appreciated that glass-based article 100 can also have any other shape such as rectangle, square, oval, or the like.

As used herein, the term "glass-based" means glasses and glass-ceramics. The glass-based article 100 may be any suitable glass or glass-ceramic that has the desired CTE and may include, for example, alkali-free aluminosilicate glasses and alkali-containing aluminosilicate glasses. In some embodiments, the glass-based article may be ion exchangeable alkali aluminosilicate glasses and glass-ceramics. In some embodiments, the alkali aluminosilicate glass comprises at least about 2 mol % $P_2O_5$, or at least about 4 mol % $P_2O_5$, wherein $(M_2O_3(\text{mol }\%)/R_xO(\text{mol }\%))<1$, wherein $M_2O_3=Al_2O_3+B_2O_3$, and wherein $R_xO$ is the sum of monovalent and divalent cation oxides present in the alkali aluminosilicate glass. In some embodiments, the monovalent and divalent cation oxides are selected from the group consisting of $Li_2O$, $Na_2O$, $K_2O$, $Rb_2O$, $Cs_2O$, MgO, CaO, SrO, BaO, and ZnO. In some embodiments, the glass is lithium-free and comprises or consists essentially of from about 40 mol % to about 70 mol % $SiO_2$; from about 11 mol % to about 25 mol % $Al_2O_3$; from about 2 mol % $P_2O_5$, or from about 4 mol % to about 15 mol % $P_2O_5$; from about 10 mol % $Na_2O$, or from about 13 mol % to about 25 mol % $Na_2O$; from about 13 to about 30 mol % $R_xO$, where $R_xO$ is the sum of the alkali metal oxides, alkaline earth metal oxides, and transition metal monoxides present in the glass; from about 11 mol % to about 30 mol % $M_2O_3$, where $M_2O_3=Al_2O_3+B_2O_3$; from 0 mol % to about 1 mol % $K_2O$; from 0 mol % to about 4 mol % $B_2O_3$, and 3 mol % or less of one or more of $TiO_2$, MnO, $Nb_2O_5$, $MoO_3$, $Ta_2O_5$, $WO_3$, $ZrO_2$, $Y_2O_3$, $La_2O_3$, $HfO_2$, CdO, $SnO_2$, $Fe_2O_3$, $CeO_2$, $As_2O_3$, $Sb_2O_3$, Cl, and Br; wherein $1.3<[(P_2O_5+R_2O)/M_2O_3]\leq2.3$, where $R_2O$ is the sum of monovalent cation oxides present in the glass. In some embodiments, the glass is lithium-free and, in other embodiments, comprise up to about 10 mol % $Li_2O$, or up to about 7 mol % $Li_2O$. The glass is described in U.S. Pat. No. 9,156,724 by Timothy M. Gross, entitled "Ion Exchangeable Glass with High Crack Initiation Threshold," the contents of which is incorporated herein by reference in its entirety.

In some embodiments, glass-based article 100 has a CTE of about $25\times10^{-7}/°$ C. or greater, about $30\times10^{-7}/°$ C. or greater, about $35\times10^{-7}/°$ C. or greater, about $40\times10^{-7}/°$ C. or greater, about $50\times10^{-7}/°$ C. or greater, about $60\times10^{-7}/°$ C. or greater, about $70\times10^{-7}/°$ C. or greater, about $80\times10^{-7}/°$ C. or greater, about $90\times10^{-7}/°$ C. or greater, about $100\times10^{-7}/°$ C. or greater, about $110\times10^{-7}/°$ C. or greater, or about $120\times10^{-7}/°$ C. or greater over a temperature range of 25-300° C. In some embodiments, glass-based article 100 has a CTE in a range from about $25\times10^{-7}/°$ C. to about $130\times10^{-7}/°$ C., about $25\times10^{-7}/°$ C. to about $100\times10^{-7}/°$ C., about $25\times10^{-7}/°$ C. to about $90\times10^{-7}/°$ C., about $25\times10^{-7}/°$ C. to about $75\times10^{-7}/°$ C., about $30\times10^{-7}/°$ C. to about $100\times10^{-7}/°$ C., about $30\times10^{-7}/°$ C. to about $90\times10^{-7}/°$ C., about $30\times10^{-7}/°$ C. to about $75\times10^{-7}/°$ C., about $40\times10^{-7}/°$ C. to about $100\times10^{-7}/°$ C., about $40\times10^{-7}/°$ C. to about $90\times10^{-7}/°$ C., about $40\times10^{-7}/°$ C. to about $75\times10^{-7°}$ C., about $50\times10^{-7}/°$ C. to about $100\times10^{-7}/°$ C., about $50\times10^{-7}/°$ C. to about $90\times10^{-7}/°$ C., or about $50\times10^{-7}/°$ C. to about $75\times10^{-7}/°$ C. over a temperature range from 25° C. to 300° C. The CTE may be measured using a push-rod dilatometer in accordance with ASTM E228-11.

In some embodiments, first surface 102 and/or second surface 104 of glass-based article 100 may have a flatness of less than or equal to about 25 μm, less than or equal to about 23 μm, less than or equal to about 20 μm, less than or equal to about 18 μm, less than or equal to about 15 μm, less than or equal to about 13 μm, less than or equal to about 10 μm, less than or equal to about 8 μm. less than or equal to about 5 μm. In some embodiments, first surface 102 and/or second surface 104 of glass-based article 100 may have a flatness in a range from about 3 μm to about 25 μm, about 5 μm to about 25 μm, about 8 μm to about 25 μm, about 10 μm to about 25 μm, about 13 μm to about 25 μm, about 15 μm to about 25 μm, about 15 μm to about 23 μm, or about 15 μm to about 20 μm, and any ranges or sub-ranges therebetween. As used herein, the term flatness is defined as a sum of the absolute values of the maximum distances which are respectively measured between a highest point and a least squares focal plane applied to a shape of the glass-based article 100 and a lowest point and the least squares focal plane. The highest point and the lowest point are both with respect to the same surface of the glass-based article 100. The least squares focal plane is applied to the shape of the unclamped (free state) glass-based article. The least squares focal plane is determined by the following method. A plane is determined by the equation $z=A+Bx-Cy$. Then, the least squares planar fit is determined through matrix minimization of the sum of the squares of the deviations of the real data from the plane. This method finds the least squares values A, B, and C. The matrices are determined as follows:

$$\begin{bmatrix} n & \sum x_j & \sum y_j \\ \sum x_j & \sum x_j^2 & \sum x_j * y_i \\ \sum y_j & \sum x_j * y_i & \sum y_j^2 \end{bmatrix} * \begin{bmatrix} A \\ B \\ C \end{bmatrix} =$$

By solving this equation for A, B, and C, the least squares fit is complete. The flatness may be measured using a Tropel FlatMaster MSP (Multi-Surface Profiler).

In some embodiments, a maximum optical retardation is measured with an optical path 114 perpendicular to first surface 102 and second surface 104, that is through the thickness of the article, and is at the edge of the surface (e.g., edge 106 for first surface 102 and edge 108 for second surface 104). In some embodiments, the maximum optical retardation is less than or equal to about 40 nm, less than or equal to about 38 nm, less than or equal to about 35 nm, less than or equal to about 33 nm, less than or equal to about 30 nm, less than or equal to about 28 nm, less than or equal to about 25 nm, less than or equal to about 23 nm, less than or equal to about 20 nm, less than or equal to about 18 nm less than or equal to about 15 nm, less than or equal to about 13 nm, less than or equal to about 10 nm, less than or equal to about 8 nm, less than or equal to about 5 nm, less than or equal to about 4 nm, or less than or equal to about 3 nm. In some embodiments, the maximum optical retardation is in a range from greater than 0 to about 40 nm, greater than 0 to about 35 nm, greater than 0 to about 30 nm, greater than 0 to about 25 nm, greater than 0 to about 20 nm, greater than 0 to about 15 nm, greater than 0 to about 13 nm, greater than 0 to about 10 nm, greater than 0 to about 8 nm, greater than 0 to about 5 nm, about 2 nm to about 40 nm, about 2 nm to about 35 nm, about 2 nm to about 30 nm, about 2 nm to about 25 nm, about 2 nm to about 20 nm, about 2 nm to about 15 nm, about 2 nm to about 13 nm, about 2 nm to about 10 nm, about 5 nm to about 40 nm, about 5 nm to about 35 nm, about 5 nm to about 30 nm, about 5 nm to about 25 nm, about 5 nm to about 20 nm, about 5 nm to about 15 nm, about 5 nm to about 13 nm, about 5 nm to about 10 nm, about 8 nm to about 15 nm, about 8 nm to about 13 nm, and all ranges and sub-ranges therebetween. The optical retardation may be measured according to ASTM F218-13.

As part of the measurement, retardation is measured with an optical path 114 generally perpendicular to surfaces 102 and 104, which is through the thickness. This is the integrated retardation through the thickness from surface 102 through 104 (or similarly may be measured with the opposite path through the thickness from surface 104 through 102) Retardation magnitude and slow axis orientation are mapped at locations relative to position on the surface. The slow axis is aligned with tension, and perpendicular to compression. At the outer edge, there is no external force beyond the edge, thus, if the slow axis of the optical retardation is perpendicular to the edge at the edge, then this is indicative of the edge being under compressive stress and if the slow axis of the optical retardation is parallel to the edge at the edge, then this is indicative of the edge being under tension. For example, on round parts, if the slow axis of the optical retardation is radial at the edge, then this is indicative of the edge being under compressive stress and if the slow axis of the optical retardation is tangential at the edge, then this is indicative of the edge being under tension.

For measurements away from the edge, one can examining the slow axis orientation relative to a line extending from the edge to a center point of the surface. In some embodiments, the glass-based article 100 is under compressive stress (i.e., the slow axis is perpendicular to the edge) at edge 106/108 and under tension (i.e., the slow axis is parallel to a line extending from the edge to the center point) at a center point. Having the edge under compressive stress and the center point under tension may be advantageous in that it increases the durability and shape stability of glass-based article 100.

In other embodiments, the glass-based article 100 is under tension (i.e., the slow axis is parallel to the edge) at edge 106/108 and under compressive stress (i.e., the slow axis is perpendicular to a line extending from the edge to the center point) at a center point. Having the edge under tension and the center point under compressive stress may be advantageous in that it causes glass-based article 100 to have a dome shape, which may be useful for handling glass-based article 100 with semiconductor industry equipment.

Figure 2:
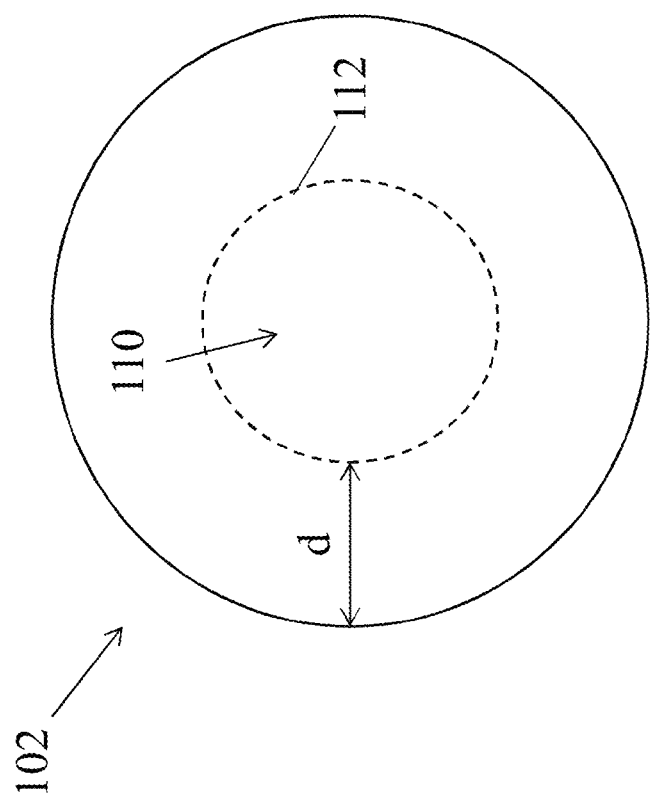
FIG. 2 is a plan view of an exemplary glass-based article showing a boundary of a central region.

In some embodiments, as shown for example in FIG. 2, the optical retardation of a first surface 102 of the article decreases from the edge toward a central region 110 of first surface 102. Central region 110 having a boundary 112 defined by a distance d from the edge toward a center point of the first surface, wherein the distance d is ½ of the shortest distance from the edge to the center point. In FIG. 2, where the article is a circle, the distance d is ½ the radius of the circle. However, the article having a circular shape is merely exemplary and as noted above may also be a rectangle, square, or oval. In some embodiments, at least one area in the central region has an optical retardation of zero. In some embodiments, there is a single area in the central region that has an optical retardation of zero, for example when the article is circular in shape. In other embodiments, there is two distinct areas in the central region that has an optical retardation of zero, for example when the article is rectangular or square in shape. In some embodiments, the optical retardation profile of a surface of the glass-based article 100 is symmetrical such that the optical retardation a given distance from a center point of a surface of glass-based article 100 is the same in any direction along the plane of the surface, for example when the glass-based article 100 is circular. In some embodiments, the optical retardation is a gradient along a surface of glass-based article 100 such that the minimum optical retardation is at a center of the surface and the maximum optical retardation is at an edge of the surface.

The glass-based articles disclosed above having the specified maximum optical retardation at the edge, optical retardation profile, stress distributions and/or flatness may be achieved using the following exemplary process: pressing a glass-based substrate between two surfaces; heating the glass-based substrate pressed between the two surfaces such that the entire glass-based substrate is above a first temperature, wherein the first temperature is above the annealing temperature of the glass-based substrate; holding the glass-based substrate pressed between the two surfaces at the first temperature for a predetermined time; and cooling the glass substrate pressed between the two surfaces after the predetermined time such that the entire glass-based substrate is below a second temperature, wherein the second temperature is below the strain point of the glass substrate.

Figure 3:
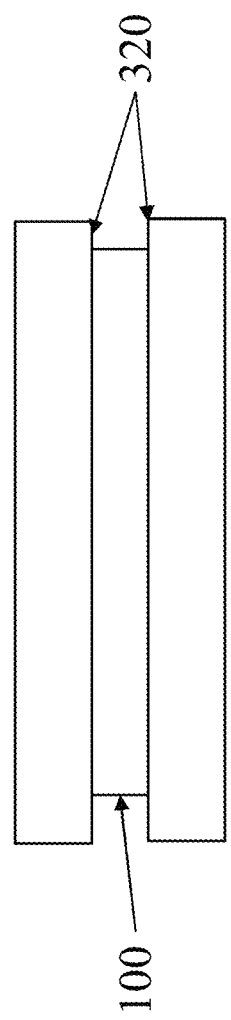
FIG. 3 is an illustration of an assembly of glass-based substrate pressed between two pressing surfaces.

In some embodiments, as shown in FIG. 3, a glass-based substrate 100 is placed between two pressing surfaces 320. FIG. 3, shows a single glass-based substrate 100 placed between pressing surfaces 320, but this is merely exemplary. In some embodiments, a stack of glass-based substrates may be placed between the two pressing surfaces and a pressing surface may also be interleaved between the glass-based substrates. Pressing surfaces 320 may be made of any suitable material that permits heat transfer to glass-based substrate 100, for example fused silica plates. In some embodiments, the pressing surfaces 320 may have a flatness of about 25 µm or less or about 20 µm or less, and a surface roughness ($R_a$) in a range from about 750 nm to about 900 nm. The flatness may be measured using a Tropel FlatMaster MSP (Multi-Surface Profiler). The surface roughness ($R_a$) may be measured using a surface profilometer available from Zygo where the surface roughness ($R_a$) in at least three sample areas of about 100 µm by 100 µm are measured and averaged. In some embodiments, an external pressure is applied to the assembly. In other embodiments the pressure applied to the glass-based substrate is the force of gravity from the plate.

In some embodiments, heating the assembly of the pressing surfaces and glass-based material to above the annealing temperature to a first temperature occurs at a rate in a range from about 1° C./min to about 10° C./min. In some embodiments, the heat is applied by heating the assembly of the glass-based substrate and the pressing surfaces in a furnace. In other embodiments, the glass-based substrate may be heated by induction or microwave heating. In some embodiments, the first temperature is about 5° C. or about 10° C. above the annealing temperature of the glass-based substrate. In some embodiments, the first temperature is in a range from about 5° C. to about 10° C. above the annealing temperature of the glass-based substrate.

In some embodiments, the predetermined time for holding the temperature at the first temperature is about 30 minutes, about 1 hour, about 2 hours, about 3 hours, about 4 hours. In some embodiments, the predetermined time for holding the temperature at the first temperature is in a range from about 1 hour to about 5 hours, about 1 hour to about 4 hours, about 1 hour to about 3 hours, about 2 hours to about 5 hours, about 2 hours to about 4 hours, or about 3 hours to about 5 hours.

In some embodiments, the cooling occurs at a rate of about 1-2° C./min or less. In some embodiments, the second temperature is greater than or equal to about 50° C. below the strain point of the glass-based substrate. In some embodiments, the assembly of glass-based substrate 100 and pressing surfaces 320 are allowed to cool by removing the application of heat. In some embodiments, the cooling is assisted, for example with the use of forced air. In other embodiments, the cooling is not assisted. In some embodiments, cooling is assisted so that the edge of glass-based substrate 100 cools down faster than the center of glass-based substrate 100. In some embodiments, the edge of glass-based substrate 100 may be about 1° C., about 2° C., about 3° C., about 4° C., about 5° C., about 6° C., about 7° C., about 8° C., about 9° C., about 10° C., about 11° C., or about 12° C. cooler than a center of glass-based substrate 100. In some embodiments, the edge of glass-based substrate 100 may be in a range from about 1° C. to about 12° C., about 1° C. to about 11° C., about 1° C. to about 10° C., about 1° C. to about 9° C., about 1° C. to about 8° C., about 1° C. to about 7° C., about 1° C. to about 6° C., about 1° C. to about 5° C., about 1° C. to about 4° C., about 1° C. to about 3° C., about 1° C. to about 2° C., about 2° C. to about 12° C., about 2° C. to about 11° C., about 2° C. to about 10° C., about 2° C. to about 9° C., about 2° C. to about 8° C., about 2° C. to about 7° C., about 2° C. to about 6° C., about 2° C. to about 5° C., about 2° C. to about 4° C., about 2° C. to about 3° C., about 3° C. to about 12° C., about 3° C. to about 11° C., about 3° C. to about 10° C., about 3° C. to about 9° C., about 3° C. to about 8° C., about 3° C. to about 7° C., about 3° C. to about 6° C., about 3° C. to about 5° C., about 3° C. to about 4° C., about 4° C. to about 12° C., about 4° C. to about 11° C., about 4° C. to about 10° C., about 4° C. to about 9° C., about 4° C. to about 8° C., about 4° C. to about 7° C., about 4° C. to about 6° C., about 4° C. to about 5° C. cooler than a center of glass-based substrate 100 during cooling. In some embodiments, the greater the difference in temperature between the edge and the center during cooling, the greater the difference in optical retardation between the edge and the central region of the glass-based substrate.

Treating a glass-based substrate to the above process results in a glass-based article with a surface having an edge under compressive stress and a center point under tension. It is believed that as the edge cools faster than the center the edge reaches the reaches the strain point first, thereby locking the edge's size and shape. As the substrate continues to cool from the edge to the center, the substrate contracts and since the edge reaches the strain point first, the contraction pulls radially towards the center, thereby resulting in a compressive stress on the edge and a radial tension on the center.

In some embodiments, cooling is assisted so that the center of glass-based substrate 100 cools down faster than the edge of glass-based substrate 100. In some embodiments, the center of glass-based substrate 100 may be about 1° C., about 2° C., about 3° C., about 4° C., about 5° C., about 6° C., about 7° C., about 8° C., about 9° C., about 10° C., about 11° C., or about 12° C. cooler than an edge of glass-based substrate 100. In some embodiments, the center of glass-based substrate 100 may be in a range from about 1° C. to about 12° C., about 1° C. to about 11° C., about 1° C. to about 10° C., about 1° C. to about 9° C., about 1° C. to about 8° C., about 1° C. to about 7° C., about 1° C. to about 6° C., about 1° C. to about 5° C., about 1° C. to about 4° C., about 1° C. to about 3° C., about 1° C. to about 2° C., about 2° C. to about 12° C., about 2° C. to about 11° C., about 2° C. to about 10° C., about 2° C. to about 9° C., about 2° C. to about 8° C., about 2° C. to about 7° C., about 2° C. to about 6° C., about 2° C. to about 5° C., about 2° C. to about 4° C., about 2° C. to about 3° C., about 3° C. to about 12° C., about 3° C. to about 11° C., about 3° C. to about 10° C., about 3° C. to about 9° C., about 3° C. to about 8° C., about 3° C. to about 7° C., about 3° C. to about 6° C., about 3° C. to about 5° C., about 3° C. to about 4° C., about 4° C. to about 12° C., about 4° C. to about 11° C., about 4° C. to about 10° C., about 4° C. to about 9° C., about 4° C. to about 8° C., about 4° C. to about 7° C., about 4° C. to about 6° C., about 4° C. to about 5° C. cooler than an edge of glass-based substrate 100 during cooling. Treating a glass-based substrate to the above cooling process results in a glass-based article with a surface having a center under compressive stress and an edge under tension. In some embodiments, the greater the difference between the temperature of the edge and the center during cooling, the greater the difference in optical retardation between the edge and the central region of the glass-based substrate.

EXAMPLES

Various embodiments will be further clarified by the following examples.

Example 1

Glass wafers having a diameter of 12 inches and 1.1 mm thickness were provided in stacks of five with a fused silica plate of 310 mm diameter and 10 mm thickness placed between the glass wafers. This assembly was pressed between two 30 mm fused silica plates. The composition of the glass wafers was about 57.43 mol % $SiO_2$, 16.1 mol % $Al_2O_3$, 17.05 mol % NaO, 2.81 mol % MgO, 0.07 mol % $SnO_2$, and 6.54 mol % $P_2O_5$. The assembly was placed in a furnace and heated to a target temperature of 652° C. at a rate of about 10° C./min, the assembly was held at 652° C. for 1 hour and then cooled to 200° C. at a controlled rate of about 1° C./min. The assembly was then allowed to cool to room temperature at an uncontrolled rate. Table 1 below provides the flatness of five samples before and after subjecting the wafers to the heat treatment described above. The flatness of both the upward facing (up side) and downward facing (down side) for each sample was measured using a Tropel FlatMaster MSP (Multi-Surface Profiler).

TABLE 1

| Sample | Flatness (μm) Up Side | | Flatness (μm) Down Side | |
|---|---|---|---|---|
|  | Pre-heat | Post-heat | Pre-heat | Post-heat |
| 1 | 40.3 | 14.1 | 57.7 | 13.8 |
| 2 | 70.9 | 24.9 | 85.2 | 20.3 |
| 3 | 58.3 | 20.7 | 50.5 | 17.5 |
| 4 | 100.0 | 32.2 | 51.4 | 19.7 |
| 5 | 17.8 | 46.6 | 23.0 | 20.8 |

Figure 4:
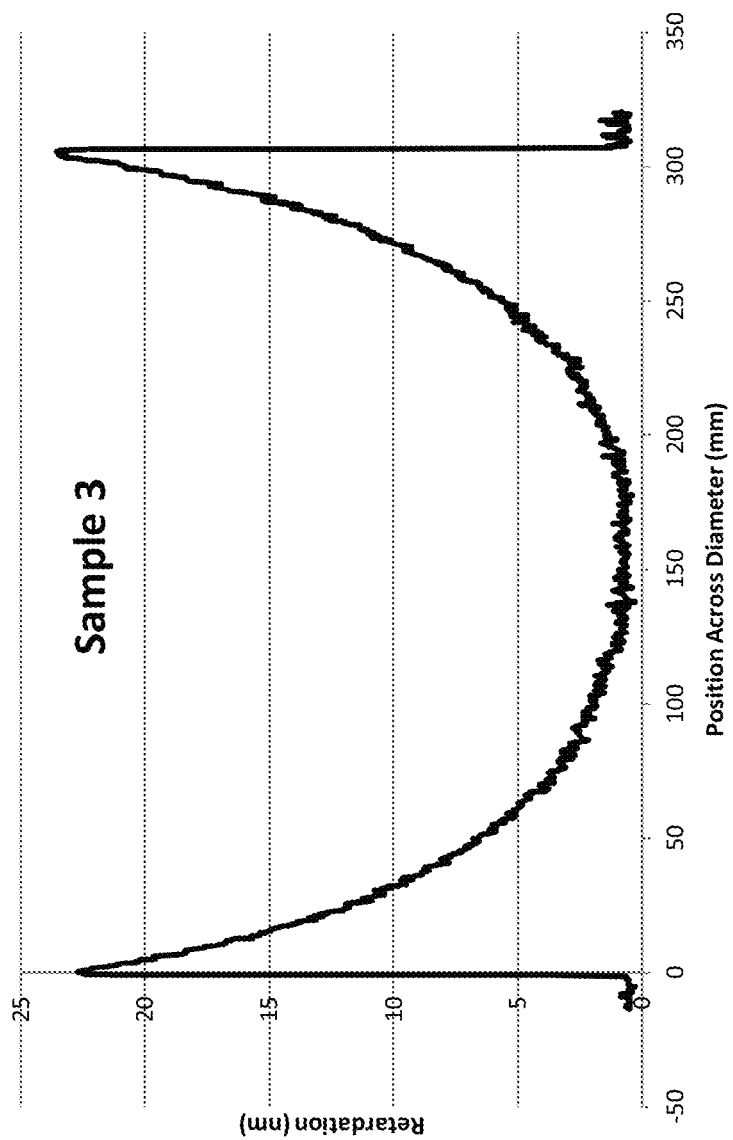
FIG. 4 is an exemplary optical retardation profile of Sample 3 in Example 1.

As can be seen in the data above, the process generally lowers the flatness value on both surfaces. FIG. 4 is a graph of the optical retardation along the diameter of sample 3. As can be seen in FIG. 4, an optical retardation at the edge of less than 25 nm was achieved. The plotted data in FIG. 4 had a median filter applied to reduce measurement system noise and was offset so that the edge of the wafer was at zero mm. The data shown to the left of zero mm and the right of 300 mm in FIG. 4 are measurements of the retardation of the surface on which the wafer was sitting and not of the wafer itself.

Example 2

Figure 5:
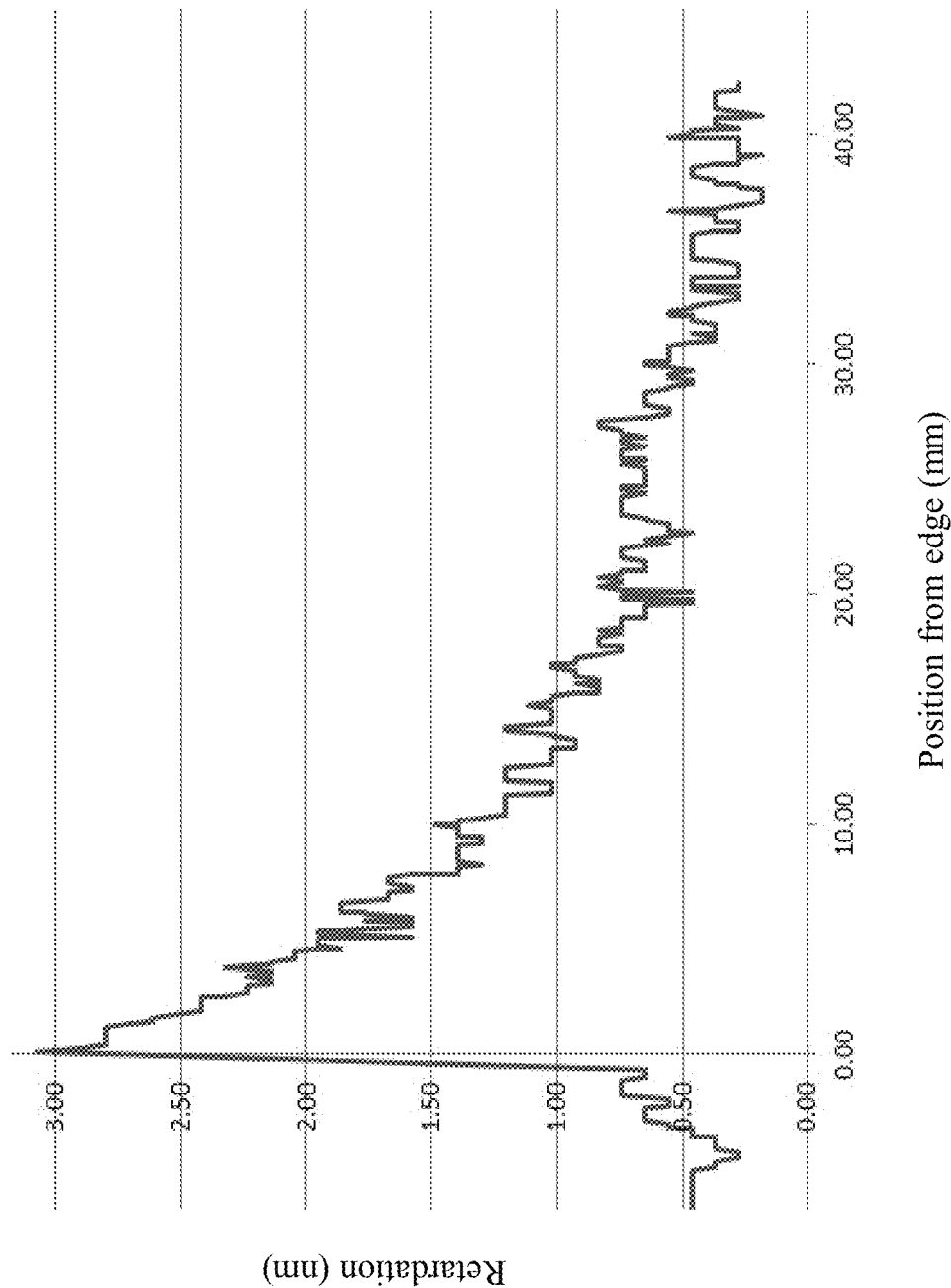
FIG. 5 is an exemplary optical retardation profile according to Example 2.

Glass wafers having a diameter of about 300 mm and 1.1 mm thickness were provided in stacks of five with a fused silica plate of 310 mm diameter and 2.3 mm thickness placed between the glass wafers. This assembly was pressed between two sets of three 10 mm thickness fused silica plates. The composition of the glass wafers was about 57.43 mol % $SiO_2$, 16.1 mol % $Al_2O_3$, 17.05 mol % NaO, 2.81 mol % MgO, 0.07 mol % $SnO_2$, and 6.54 mol % $P_2O_5$. The assembly was placed in a furnace and heated to a target temperature of 652° C. at a rate of about 5° C./min, the assembly was held at 652° C. for 6 hours and then cooled to 200° C. at a controlled rate of about 0.5° C./min. The assembly was then allowed to cool to room temperature at an uncontrolled rate. FIG. 5 shows the optical retardation in nm plotted on the y axis and the distance from the edge in mm on the x axis. The optical retardation measurements are only shown for the first 40 mm, but shows that the maximum optical retardation occurs at the edge and decreases toward the center of the wafer. The maximum optical retardation was less than 5 nm. The plotted data in FIG. 5 had a median filter applied to reduce measurement system noise and was offset so that the edge of the wafer was at zero mm. The data shown to the left of zero mm in FIG. 5 are measurements of the retardation of the surface on which the wafer was sitting and not of the wafer itself.

It will be apparent to those skilled in the art that various modifications and variations can be made without departing from the spirit or scope of the invention.

What is claimed is:

1. A glass-based article comprising:
a first surface having an edge,
wherein a maximum optical retardation of the first surface is at the edge and the maximum optical retardation is less than or equal to about 40 nm, and
wherein the optical retardation decreases from the edge toward a central region of the first surface, the central region having a boundary defined by a distance from the edge toward a center point of the first surface, wherein the distance is ½ of the shortest distance from the edge to the center point.

2. The glass-based article of claim 1, wherein the first surface has a flatness of less than or equal to about 25 μm.

3. The glass-based article of claim 1, wherein the article has a coefficient of thermal expansion (CTE) in a range from about $25\times10^{-7}$/° C. to about $130\times10^{-7}$/° C. over a temperature range from 25° C. to 300° C.

4. The glass-based article of claim 1, wherein the optical retardation at any point along the boundary of the central region is the same.

5. The glass-based article of claim 1, wherein a shape of the glass-based article is selected from the group consisting of a circle, a square, a rectangle and an oval.

6. The glass-based article of claim 1, wherein an optical retardation profile on the first surface is symmetrical relative to the center point of the surface.

7. The glass-based article of claim 1, wherein the maximum optical retardation is less than or equal to about 25 nm.

8. The glass-based article of claim 1, wherein the maximum optical retardation is less than or equal to about 5 nm.

9. The glass-based article of claim 1, wherein the first surface has a flatness of less than or equal to about 20 μm.

10. The glass-based article of claim 1, wherein the edge of the first surface is under compressive stress.

11. The glass-based article of claim 10, wherein a center of the first surface is under tension.

12. The glass-based article of claim 1, wherein the edge of the first surface is under tension.

13. The glass-based article of claim 12, wherein the center of the first surface is under compressive stress.

14. The glass-based article of claim 1, further comprising a second surface opposing the first surface, wherein a maximum optical retardation of the second surface is at an edge and the maximum optical retardation is less than or equal to about 40 nm.

15. The glass-based article of claim 14, wherein the first surface has a flatness of less than or equal to about 25 μm.

16. The glass-based article of claim 15, wherein the second surface has a flatness of less than or equal to about 25 μm.

17. The glass-based article of claim 1, wherein the article is glass or glass-ceramic.

* * * * *